United States Patent [19]

Ohkawa et al.

[11] Patent Number: 4,665,412
[45] Date of Patent: May 12, 1987

[54] COUPLED HETEROSTRUCTURE SUPERLATTICE DEVICES

[75] Inventors: Tihiro Ohkawa, LaJolla; Lawrence D. Woolf, Carlsbad, both of Calif.

[73] Assignee: GA Technologies Inc., San Diego, Calif.

[21] Appl. No.: 746,994

[22] Filed: Jun. 19, 1985

[51] Int. Cl.$^4$ ............................................. H01L 49/02
[52] U.S. Cl. ........................................... 357/6; 357/4; 357/16
[58] Field of Search .................. 357/4, 45 L, 6, 16

[56] References Cited

U.S. PATENT DOCUMENTS

| 4,103,312 | 7/1978 | Chang et al. | 357/4 X |
| 4,250,515 | 2/1981 | Esoki et al. | 357/16 |
| 4,286,275 | 8/1981 | Heiblum | 357/4 X |
| 4,348,686 | 9/1982 | Esoki et al. | 357/4 SL |
| 4,396,931 | 8/1983 | Dremke | 357/4 |

OTHER PUBLICATIONS

Heiblum, *Solid State Electronics*, 24, 343, (1981).
Ishiwara, et al, *Appl. Phys. Lett.*, 40, 66, (1982).

Primary Examiner—Martin H. Edlow
Attorney, Agent, or Firm—Fitch, Even, Tabin & Flannery

[57] ABSTRACT

A superlattice quantum well device comprising a first set of conductive layers and a second set of conductive layers having discrete electronic energy levels different from those of the first set of layers, separated by relatively nonconductive insulation layers.

11 Claims, 6 Drawing Figures

COUPLED HETEROSTRUCTURE SUPERLATTICE DEVICES

The present invention is directed to solid state electronic devices, and more particularly, is directed to quantum well solid state devices comprising a plurality of layers of materials which provide electronic devices having properties generally differing from the bulk properties of the respective layer materials.

BACKGROUND OF THE INVENTION

Various properties of bulk semiconductor materials and devices are primarily dependent on the magnitude of the energy gap between the conduction band and the valence band of the semiconductor material, as well as the direct or indirect nature of the energy gap between the conduction and valence bands. Quantrum-well structures and superlattices are also known which have a variety of structure-related properties, such as resonant tunnelling, the quantrum Hall effect and quantum-well lasing [Holonyak, et al., "Quantum-Well Heterostructure Lasers", IEEE, J. Quantum Elec. QE-16, 170, (1980); Stormer, et al., "The Quantized Hall Effect", Science, 220, 1241 (1983); Takebe, et al., "Negative Resistance in a Triple Barrier Structure of Al-Al$_2$O$_3$", Appl. Phys. Lett. 31, 636 (1977); Chang, et al., "Resonant Tunneling in Semiconductor Double Barriers", Appl. Phys. Lett., 24, 593 (1974); Sollner, et al., "Resonant Tunneling Through Quantrum-Wells at Frequencies up to 2.5 THz", Appl. Phys. Lett. 43, 588 (1983); Vojak; et al. "Low Temperature Operation of Multiple Quantum-Well Al$_x$Ga$_{1-x}$As/GaAs ph Heterostructure Lasers Grown by Metalorganic Chemical Vapor Deposition", J. Appl. Phys., 50, 5830, (1979); Tsu, et al., "Tunneling in a Finite Superlattice", Appl. Phys. Lett. 22, 562 (1973)]. However, such conventional quantum well devices are limited in electronic properties. Quantrum well heterostructure devices or synthetic semiconductors would be desirable in which one or more electronic energy gaps of the devices may be selected over a broad range of values, even in a range outside the typical range of conventional commercial semiconductors.

Accordingly, it is an object of the present invention to provide such improved devices. These and other objects of the present invention will become more apparent from the following detailed description and the accompanying drawings, of which FIG. 1 is a cross sectional view, partially broken away, of an embodiment of a coupled, superlattice device in accordance with the present invention;

Figure 6:
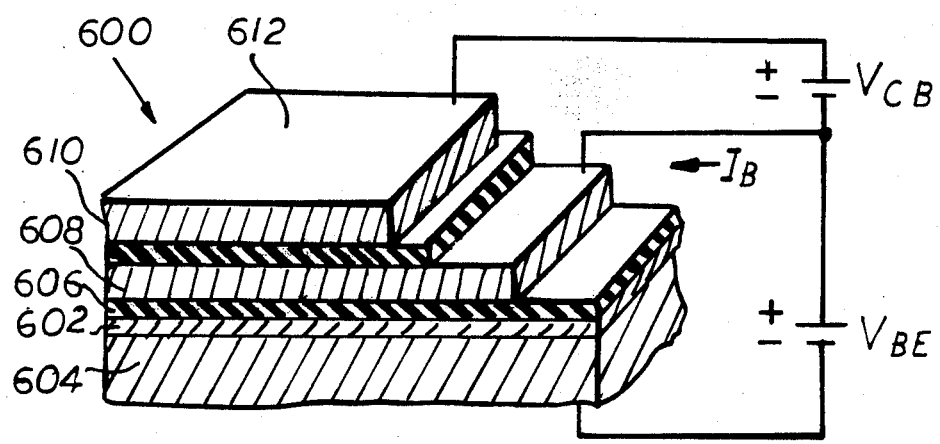
Figure 5:
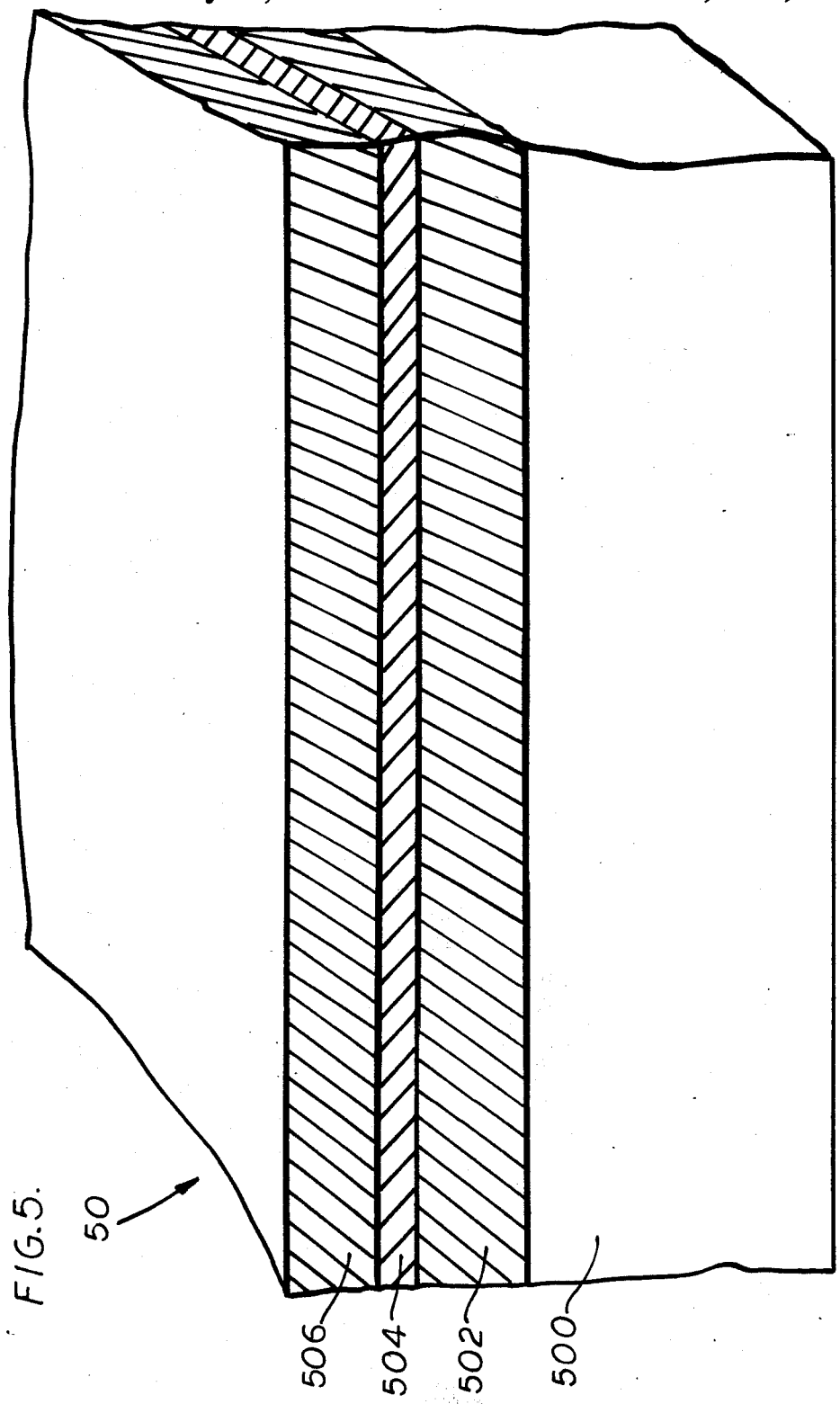

FIG. 5 is an embodiment of a composite coupled quantum well heterostructure device in accordance with the present invention having multiple coupled composite superlattice arrays of different bandgap; and FIG. 6 is a cross sectional side view of a tunnelling hot electron transfer amplifier utilizing an embodiment of an epitaxial monocrystalline metal/insulator quantum well heterostructure, together with an energy level diagram in registration therewith.

Generally in accordance with the present invention, superlattice quantum well devices are provided which comprise an integral periodic array of a plurality of quantum mechanically coupled conductive layers separated by relatively nonconductive insulation layers, in which the conductive layers comprise a first set of conductive layers each having a first set of discrete electronic energy levels of predetermined energy spacing and a second set of conductive layers each having a second set of discrete electronic energy levels of predetermined energy spacing different from the energy spacing of the first set of conductitve layers. The conductive layers of the first set of layers is interleaved with the conductive layers of the second set of layers such that charge carriers may resonantly tunnel in the array through the insulator layers between the conductive layers of the first set of conductive layers, and conductive layers of said second set of conductive layers at an energy level common to both the first set of discrete energy levels of the first set of conductive layers and the second set of energy levels of the second set of conductive layers. Because the energy levels are different in the different sets of quantum well conductive layers, the common energy will be a function of the energy level differences in the two layers, and may be controlled by controlling the energy level spacing of the respective sets of quantum well layers. The periodicity of an extended array of the quantum well layers having different energy level spacings provides a discrete energy band in the direction of the lattice layer periodicity. Generally, at least about 10 and more preferably at least about 100 conductive quantum well layers separated by thin insulator tunneling barrier layers will be provided in the array.

It is important that the conductive layers are sufficiently thin so that they provide the necessary discrete energy levels, and that the insulation layers are sufficiently thin to provide adequate resonance tunneling between the conductive quantum well layers. Conductive layers of a metallic conductor such as aluminum which have a high carrier density may desirably have a thickness in the range of 10 Angstroms to about 300 Angstroms so that discrete quantum energy levels are provided. Semiconductor layers which for example have a charge carrier density in the range of from about $1 \times 10^{16}$ cm$^{-3}$ to about $1 \times 10^{21}$ cm$^{-3}$ may be substantially thicker while still providing discrete energy levels, such as in the range of from about 20 Angstroms to about 400 Angstroms.

Desirably, the energy level spacings in each layer will be at least about 10$^{-3}$eV. By providing at least two arrays of conductive quantum well layers each having different energy level spacings, a periodic structure having collective behavior at matching energy levels may be provided.

As indicated, devices in accordance with the present invention comprise an integral array of conductive layers separated by relatively nonconductive layers. The array may desirably be a monocrystalline array of conductor and insulator layers have suitably matching lattice constants; however, polycrystalline and amorphous structures are also contemplated. The conductive layers may be composed of metals, including metallic alloys, and semiconductors. Examples of suitable materials include aluminum, copper, zinc and cadmium. Examples of suitable metallic alloys include cobalt disilicide and nickel disilicide. Examples of suitable semiconductor materials include silicon, germanium and III-V compounds such as gallium arsenide. indium phosphide, gallium aluminum phosphides, indium gallium arsenides and other III-V compounds of indium, gallium, aluminum, arsenic and phosphorous. The conductor layers may have a conductivity which is predominantly provided by mobile electrons (e.g., aluminum, n-type semiconductors) or may be predominantly provided by mobile holes (e.g., divalent alkaline earth metals, p-type semiconductors). The conductive layers will desirably comprise a material which has a bulk conductivity of at least about 1 ohm$^{-1}$ cm$^{-1}$, and preferably at least about $1 \times 10^3$ ohm$^{-1}$ cm$^{-1}$. While the conductive layers are preferably homogenous in composition, one or more of the sets of conductive layers may also be composite layers of differing composition, or may have a graded composition.

As also indicated, the conductive layers are separated from each other by relatively nonconductive layers. In this regard, a relatively nonconductive layer should have an energy gap Eg which is desirably at least 0.2 electron volt, and more preferably at least 0.5 electron volts higher than the energy gap of any of the conductive layers adjacent thereto. The relatively nonconductive insulator layers should best have a bulk conductivity of less than about $1 \times 10^{-2}$ ohm$^{-1}$ cm$^{-1}$, and more preferably less than about $1 \times 10^{-8}$ ohm$^{-1}$ cm$^{-1}$. Materials which may serve as relative insulator layers include dielectric insulators having a high bandgap such as silicon dioxide, silicon nitride, aluminum oxide, calcium difluoride, barium difluoride and strontium difluoride. Semiconductors such as those previously described, provided they have a bandgap higher than the adjacent conductor layers, may also be utilized as insulator layers. Because the conductive layers of the devices of the present invention are coupled by tunnelling, it is necessary that the insulator layers be sufficiently thin that quantum mechanical tunnelling through the insulator layers between the conductive layers is permitted to a significant degree. This thickness will be a function of the relative barrier height presented to the charge carriers of the conductor quantum well layers by the insulator layers. When the relative barrier height difference between the conductor and an adjacent insulator layer is relatively large, the tunnelling probability as a function of the thickness of the insulator layer decreases substantially. The insulator layer will desirably be significantly thin to provide a reasonable tunnelling probability between adjacent conductor layers so that $$\sqrt{\frac{2mB}{\hbar^2}} \, t$$

should be in the range of from about $10^{-2}$ to about $10^2$ where B is the barrier height, m is the effective mass of the charge carrier and t is the thickness of the barrier. The lower limit of thickness of the insulator layer is determined by fabrication technique limitations to about 5 to 10 Angstroms. Dielectric insulator layers such as metal oxides or fluorides may desirably have a thickness in the range of from about 5 Angstroms to about 25 Angstroms, while semiconductor insulator layers may be substantially thicker, such as in the range of from about 20 Angstroms to about 80 Angstroms.

As indicated, devices in accordance with the present invention comprise coupled quantum well layers having different quantum well energy levels. The quantum energy level spacing of a conductive quantum well layer may be varied by varying the thickness of the conductive layer, by selecting different compositions for different layers, or by both varying the thickness and composition of the respective layers. Desirably, the energy level spacings of the first set of quantum well layers may differ from the energy level spacings of the second set of layers from about 0% to about 90% of the first layer spacing. In order to provide a narrow conduction band, respective sets of layers should best be substantially uniform in thickness in order to provide substantially uniform energy levels in each layer of the array.

Figure 1:
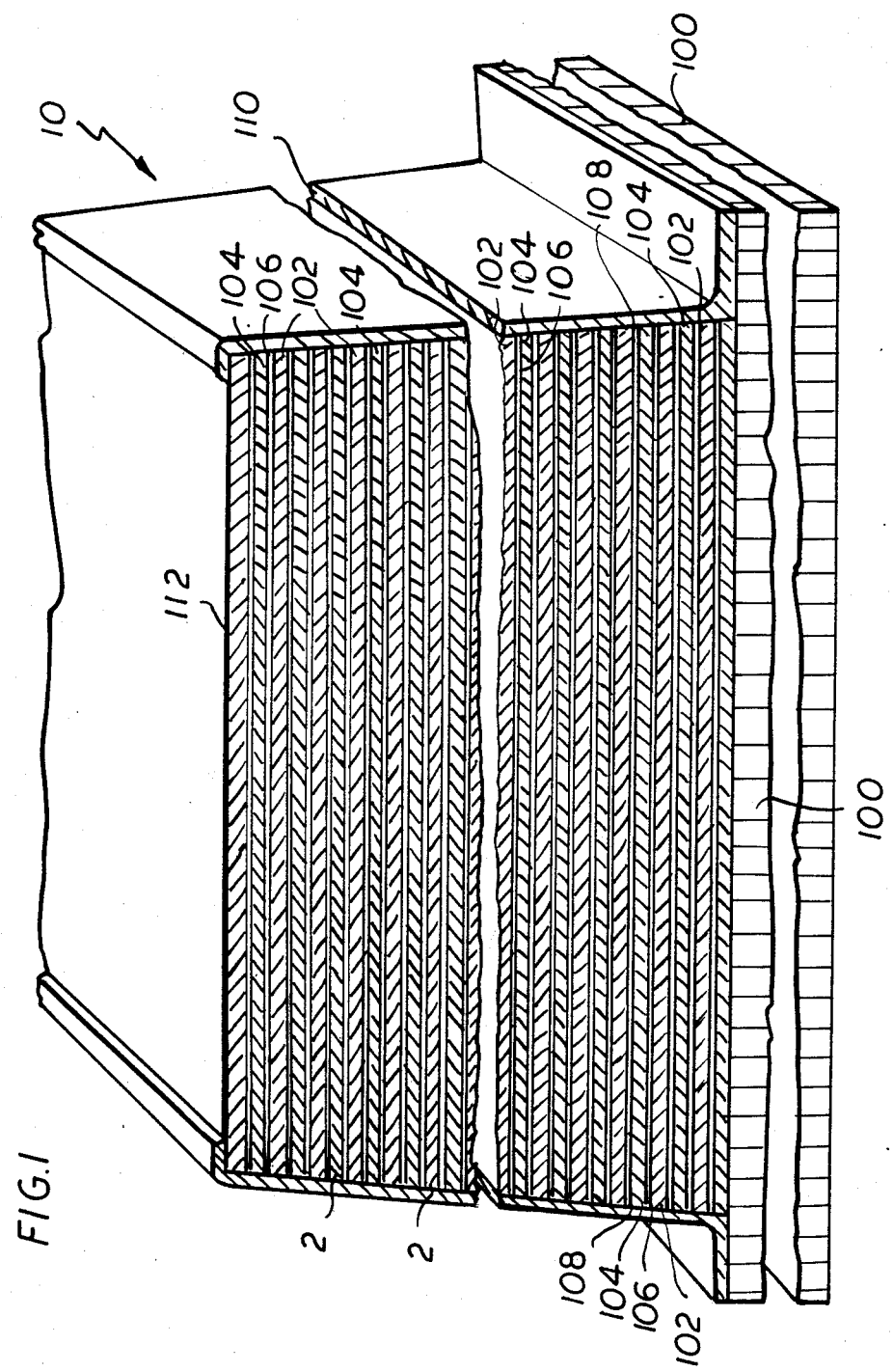

The arrays may be coupled by alternating the first set of conductive layers with the second set of conductive layers. In this regard, illustrated in FIG. 1 is a coupled heterolattice device 10 in accordance with the present invention. The illustrated device comprises a conductive substrate 100, which may be a monocrystalline substrate upon which are deposited a plurality of alternating layers of a first set of quantum well conductor layers 102 and a second set of a plurality of quantum well conductor layers 104 which are separated by dielectric interlayers 106, 108. A partial cross sectional view of the interleaved array of conductive layers 102, 104 is shown in more detail in FIG. 2.

Each of the conductive layers 102 of the first set of conductive layers and each of the conductive layers 104 of the second set of conductive layers in the coupled heterostructure 10 are sufficiently thin in the direction orthogonal to the substrate 100 that the quantum mechanical solutions have discrete, allowed energies for the charge carriers (electrons or holes) which depend upon the thickness of the respective conductive layer. In the embodiment 10, layers of conductors are provided which form a stack in which the thickness of the conductors 102, 104 alternates to produce a periodic structure having electron conduction bands in which certain of the allowed energy levels of the alternating layers in addition match each other to provide the device 10 with electronic properties which result from coupling of the heteroarray. Because of the large number of layers 102, 104, 106, 108 of the device 10, and the relative thinness of the layers, the scale of FIG. 1 is increased in a direction orthogonal to the layer planes and is broken away at the approximate midplane of the array. Similarly, because the thickness of the substrate 100 is substantially greater than the combined thickness of the layers 102, 104, 106, 108 the illustration of the substrate has also been broken away at its midplane. Electrical connection to the device 10 may be established by making ohmic contact to the substrate 100 and the top metallic layer 112. A protective organopolymeric or other dielectric layer 110 may be provided during fabrication of individual devices 10 from the layered array, in accordance with appropriate fabrication techniques.

Figure 2:
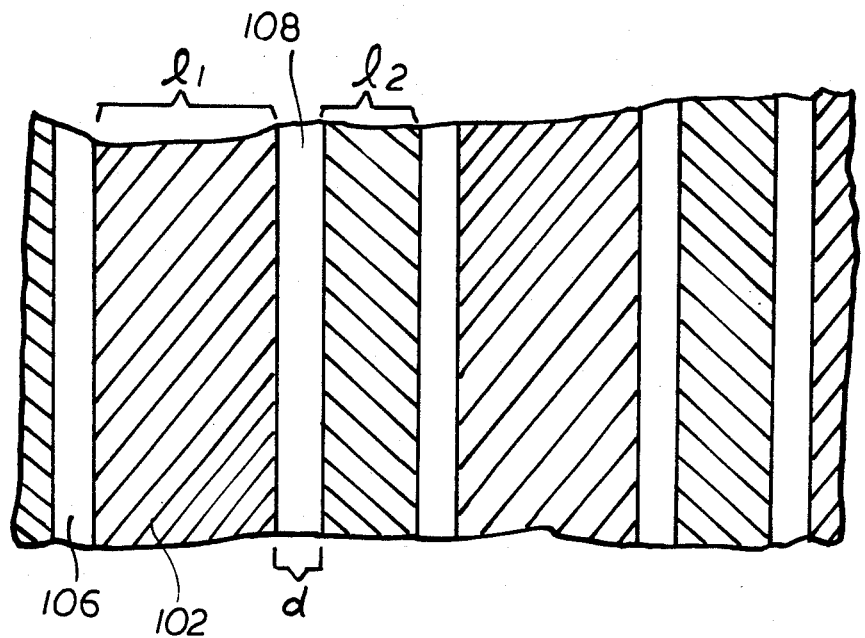
FIG. 2 is an enlarged cross sectional view of a portion of the device of FIG. 1 taken through line 2—2.
Figure 3:
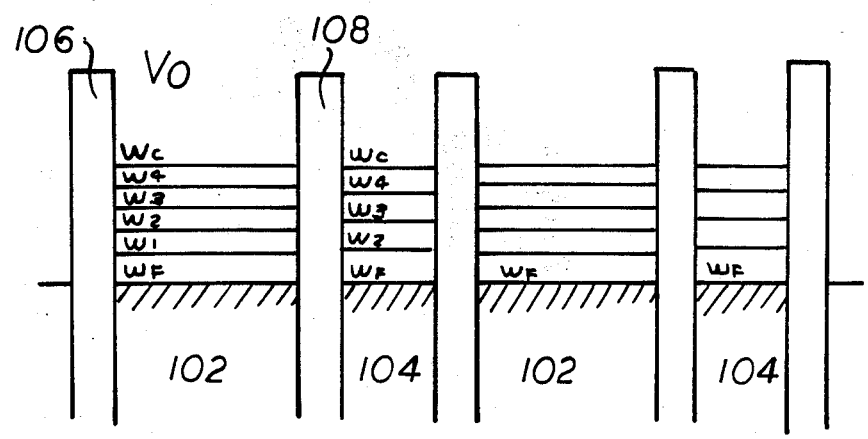
FIG. 3 is a schematic illustration of the quantum energy wells and electronic energy levels of the conductive and insulator layers of the device of FIG. 1, in registration with these elements as shown in FIG. 2.

The electronic properties of the device 10 illustrated in FIG. 1 will now be more particularly described with reference to FIG. 2 and the one dimensional system model illustrated in FIG. 3. In FIG. 2, which is an enlarged portion of FIG. 1, two conductor layers 102 of thickness $2a$ are shown alternating with two conductor layers 104 of different thickness $2b$ from layers 102. FIG. 3, which is in registration with the layers of FIG. 2, illustrate the electrical potential well structure formed by the layers of FIG. 2. As shown, the conductor layers have discrete electron energy levels $W_n$ which are of respectively different spacings above the electron Fermi level $W_f$. In the illustration of FIG. 3, the ratio of the energy level spacings of the quantum energy levels of the layers 102 to 104 is a ratio of 5:4, so that they share a common quantum well energy level $W_c$ which is the fifth energy level of layer 102 and the fourth energy level of layer 104. In the model of FIG. 3, conduction electrons in a thin metal quantum-well conductor layer 102 behave like electrons in a square potential well, in which the energy levels in an infinitely deep well are utilized as an approximation. Provided the insulation layers 106, 108 are not too thick, the electrons of common energy levels $W_c$ can tunnel from one layer 102 to an adjacent layer 104. The energy levels may be represented as:

$$W_n = \frac{\pi^2 \bar{h}^2 n^2}{8 m a^2} \tag{1}$$

where $W_n$ is the energy of the nth level, m is the effective electron mass and 2a is the thickness of the conductive sheet. A numerical example in which a is approximately 150 Angstroms provides energy levels $W_n$ as follows:

$$W_n = 0.86 \times 10^{-19} \frac{n^2}{a^2} \text{ eV} \tag{2}$$

$$= 4 \times 10^{-4} n^2 \text{ eV}$$

Outside of the thin quantum well conductor layer 102, the wave function decays exponentially as $\exp[-\beta x]$, where $\beta$ is given by $$\beta = \left\{ \frac{2m(V_o - W_n)}{\bar{h}^2} \right\}^{\frac{1}{2}} \tag{3}$$

where $V_o$ is the potential well height. For high bandgap insulator layers 106, 108, the potential well height $V_o$ may be about 3 electron volts, which is much greater than the energy of the energy levels $W_n$ under consideration. In this case, the value of $\beta$ would be about $8.7 \times 10^9$ m$^{-1}$.

Similar considerations apply with respect to the metal conductor sheet 104, which for purposes of discussion is regarded to be thinner than the sheet 102, but of the same composition and carrier density. As shown in FIG. 3, the spacings of the energy levels of the sheet 104 are greater than those of the sheet 102 as a result of the layer thickness parameter. Because of the difference in energy level spacings, an energy level $W_c$ which is sufficiently common to both layers will be provided along the energy level spectrum as shown in FIG. 3.

In the absence of applied external field, the quantum mechanical energy levels of two layers 102, 104 match when $$n_1/a_1 = n_2/a_2 \tag{4}$$

where $$\begin{matrix} n_1 = n_o N_1 \\ n_2 = n_o N_2 \end{matrix} \tag{5}$$

where $N_1$ and $N_2$ are integers and $n_o$ is a nonzero integer. The energy separation between two common levels of the different layers 102, 104 is given by $$W_{n_o+1} - W_{n_o} = \frac{\pi^2 \bar{h}^2}{8m} \left( \frac{N_1}{a_1} \right)^2 [(n_o + 1)^2 - n_o^2]. \tag{6}$$

For example, for a half width of layer 102 of about 150 Angstroms and a thickness ratio of layers 102, 104 corresponding to a value of $N_1 = 10$, the following relationship is obtained:

$$W_{n_o+1} - W_{n_o} = 4 \times 10^{-2}[n_o+1)^2 - n_o^2] eV \tag{7}$$

Accordingly, an energy gap between the first and second levels ($n_o = 1$) is given by $$W_2 - W_1 = 0.12 \text{ eV} \tag{8}$$

Accordingly, it will be appreciated that the illustrated structure of FIGS. 2 and 3 comprising two thin metal sheets separated by a thin dielectric insulator will provide an energy gap which is comparable to a typical semiconductor energy gap. It will be appreciated that a broad range of energy gaps may be provided by appropriate selection of design parameters and layer compositions.

There are significant energy gaps between the common levels of the layer structure illustrated in FIGS. 1-3. The key characteristic of a semiconductor is the energy gap between the conduction band and the valence band. In accordance with the present invention, conduction bands are provided with energy gaps which may be tuned to the desired values by varying the relative widths of adjacent metallic layers. The tunability of the energy gap will allow this device to operate as a photoconductive detector (photodetector) whereby the band gap of the device can be tuned to match the energy of the incident radiation so as to have a highly sensitive tunable photodetector. A superlattice heterostructure device comprising conductor sheets in which every other sheet satisfies Equation 4 and where the sheets are effectively insulated from their neighbors by their insulator layers provides electronic properties not exhibited in the individual layers. Moreover, such electronic properties should behave like a semiconductor. For example, the width of the common level (or the width of the conduction mini-band) may be made small by controlling the uniformity of the energy levels of the layers throughout an array of layers. If the width of the common level is smaller than the energy level spacings in the metallic conductors, then this device should also exhibit negative differential resistance characteristics under the application of an external potential, a characteristic similar to that exhibited by tunnel diodes.

The previous discussion has been generally limited to a one dimensional consideration of two adjacent layers, although the device 10 of FIG. 1 comprises sheets which are uniform in two dimensions and provide a periodic structure in a third dimension orthogonal to the sheet planes which is governed by the electron wave function. The periodic nature of the device will now be more fully discussed.

The electron wave function u satisfies the relationship $$-\frac{\hbar^2}{2m} \nabla^2 u + V(x)u = Wu \qquad (9)$$

where V(x) is the potential and W is the energy. A metallic sheet with thickness $l_1$ and the vacuum gap of thickness $l_2$ may be represented by the potential $$\left. \begin{array}{l} V(x) = 0 \quad 0 < x < l_1 \\ V(x) = V_o \quad l_1 < x < l_1 + l_2 \end{array} \right\} . \qquad (10)$$

Initially treating electron motion only in the (x) direction orthogonal to the conduction sheets, and disregarding electron motion in the y and z directions of the conduction sheets, the solution can be written in matrix form given by $$\begin{pmatrix} u_2 \\ \frac{\partial u_2}{\partial x} \end{pmatrix} = M \begin{pmatrix} u_o \\ \frac{\partial u_o}{\partial x} \end{pmatrix} \qquad (11)$$

where the subscripts o and 2 denote the values a x=0 and $x = l_1 l_2$ and M is given by $$M = \begin{pmatrix} \cos k_1 l_1, & k_1^{-1} \sin k_1 l_1 \\ -k_1 \sin k_1 l_1, & \cos k_1 l_1 \end{pmatrix} \begin{pmatrix} ch k_2 l_2, & k_2^{-1} sh k_2 l_2 \\ k_2 sh k_2 l_2, & ch k_2 l_2 \end{pmatrix} \qquad (12)$$

and also $$\left. \begin{array}{l} k_1^2 = \frac{2m}{\hbar^2} W \\ k_2^2 = \frac{2m}{\hbar^2} (V_o - W) \end{array} \right\} . \qquad (13)$$

The characteristic exponent $\nu$ is given by $$\cos\sigma = \tfrac{1}{2} \text{ trace } M \qquad (14)$$

$$= ch k_2 l_2 \cos k_1 l_1 + \tfrac{1}{2} \left( \frac{k_2}{k_1} - \frac{k_1}{k_2} \right) sh k_2 l_2 \sin k_1 l_1$$

$$= \left[ (ch k_2 l_2)^2 + \tfrac{1}{4} \left( \frac{k_2}{k_1} - \frac{k_1}{k_2} \right)^2 (\sin k_2 l_2)^2 \right]^{\frac{1}{2}} \cos(k_1 l_1 + \phi)$$

where $\tan\phi = \tfrac{1}{2} \left( \frac{k_2}{k_1} - \frac{k_1}{k_2} \right) coth k_2 l_2$.

The potential well $V_o$ is of the order of the work function, with $V_o >> W$ ($k_2 >> k_1$) for lower levels. Consider a limited case where $(k_2/k_1) sh k_2 l_2 >> 1$, i.e., $$\left\{ (ch k_2 l_2)^2 + \tfrac{1}{4} \left( \frac{k_2}{k_1} - \frac{k_1}{k_2} \right)^2 (sh k_2 l_2)^2 \right\}^{\frac{1}{2}} >> 1. \qquad (15)$$

Because of the repeating nature of the alternating layers of different conductor layers, it is necessary that the solution in the (x) direction be periodic.

$$k_1 l_1 + \phi \approx \frac{\pi}{2} + N\pi \qquad (16)$$

where N is an integer. Also $$\tan\phi = \tfrac{1}{2} \left( \frac{k_2}{k_1} - \frac{k_1}{k_2} \right) coth k_2 l_2 >> 1 \qquad (17)$$

or $$\phi \approx \frac{\pi}{2} .$$

The combination of Equations 16 and 17 result in $$k_1 l_1 = N\pi \qquad (18)$$

and $$W = \frac{\pi^2 \hbar^2}{2m} \frac{N^2}{l_1^2} . \qquad (19)$$

The width of the level $\Delta W$ is estimated as $$\Delta W \approx \frac{\hbar^2 k_1}{m l_1 \left[ (ch k_2 l_2)^2 + \tfrac{1}{4} \left( \frac{k_2}{k_1} - \frac{k_1}{k_2} \right)^2 (sh k_2 l_2)^2 \right]^{\frac{1}{2}}} \qquad (20)$$

$$\approx \frac{2\pi^2 \hbar^2 N^2}{m l_1^3 k_2 sh k_2 l_2}$$

and the relative width is given by $$\frac{\Delta W}{W} = \frac{4}{K_2 l_1 sh k_2 l_2} \qquad (21)$$

$$= \frac{4 k_1}{N \pi k_2 sh k_2 l_2} << 1.$$

Next considering a four-region unit as shown in FIG. 3 in which the first and third regions 102, 104 are metallic with the thickness $l_1$ and $l_3$, and the second and fourth regions 106, 108 are insulator regions of the thickness of $l_\nu$, it will be recalled that the thickness of the metal regions satisfy the relationship of Equation 4.

The matrix elements and therefore the energy levels in the first and the third regions 102, 104 become identical if $$k_1 = \frac{N_o N_1 \pi}{l_1} \qquad (22)$$

and $$k_2 = \frac{N_o N_2 \pi}{l_2}$$

where $N_o$ is an integer. They are energy modes which are common to each of the conductive quantum well layers 102, 104. The first common mode or the conduction mini-band is located at $$W_{c1} = \frac{\pi^2 \bar{n}^2}{2m} \frac{N_1^2}{l_1^2}. \tag{23}$$

The lowest level $W_1$ is at $$W_1 = \frac{\pi^2 \bar{n}^2}{2m l_1^2}. \tag{24}$$

Charge carrier motion in the direction parallel to the metallic sheets may be considered to have a form $u \propto \exp[isy]$. The dispersion is given by $$\left. \begin{array}{l} k_1^2 = \frac{2m}{\bar{n}^2} W - s^2 \\ k_2^2 = \frac{2m}{\bar{n}^2} (V_o - W) + s^2 \end{array} \right\}. \tag{25}$$

By combining the above equations, the following result may be obtained:

$$k_2^2 = \frac{2mV_o}{\bar{n}^2} - k_1^2. \tag{26}$$

Figure 4:
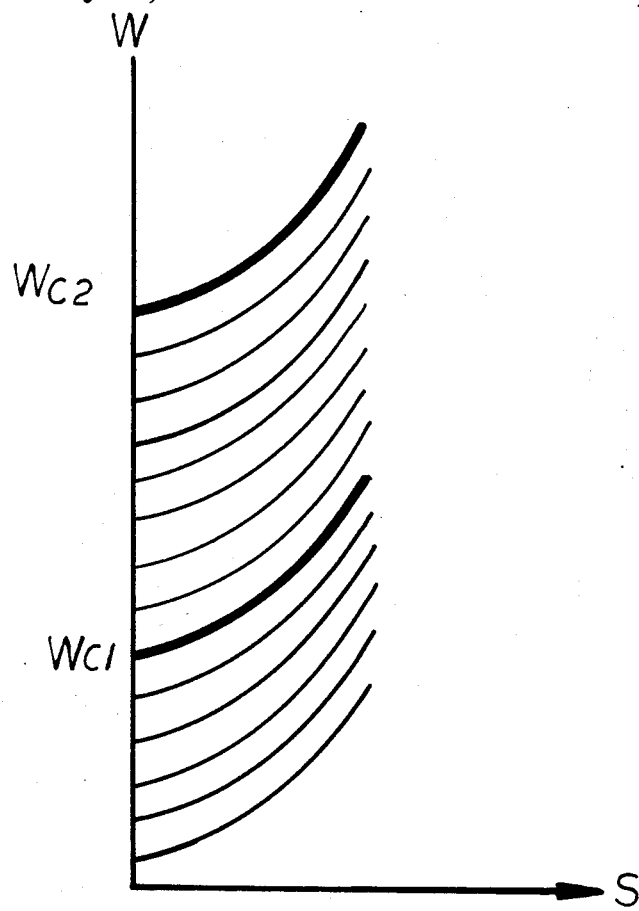
FIG. 4 is a diagram of the energy levels of the device of FIG. 1.

The evanescence in the vacuum region is independent of s because the effects of the longer path across the gap and the higher energy cancel each other. The energy of the level increases parabolically in the s direction as shown in FIG. 4. As shown in FIG. 4, the electrons would be at the top of the Fermi level (W=0) at absolute zero temperature. At a temperature $T \ll W_{c1}$, they are bound to a sheet. When the electrons are excited to $W_{c1}$, they are in a narrow conduction band.

The required accuracy of the thickness of the respective layers in order to have no overlap in energy between adjacent conduction mini-bands may be represented as follows:

$$\frac{\Delta l_1}{l_1} < \frac{1}{N_1 \pi \left[ (chk_2 l_2)^2 + \frac{1}{4} \left( \frac{k_2}{k_1} - \frac{k_1}{k_2} \right)^2 (shk_2 l_2)^2 \right]^{\frac{1}{2}}} \tag{27}$$

$$\sim \frac{\Delta W}{W}.$$

From Equation 27, it will be appreciated that the provision of a narrow conduction band requires a relatively tight tolerance in thickness.

In the illustrated embodiment 10, it is contemplated that the layers 102 and 104 may be of any suitable conductive materials for providing the appropriate quantum well energy layers, and which are compatible with the dielectric layer materials. The conductors 102, 104 may be of the same material, in which case the quantum well energy levels of the respective layers are controlled by providing layers 102 with a different thickness than the thickness of layers 104. Desirably, the layers will have a thickness ratio such that the thinner layers 102 are less than about 90% of the thickness of the thicker layers 104, although it will be appreciated that the thickness ratio may more closely approach 1 in order to provide higher bandgap behavior. It will also be appreciated that energy level differences may be provided by employing alternating layers of different conductive layers of materials which may or may not have the same thickness. Suitable materials include conductive materials such as aluminum, conductive alloys such as cobalt disilicide and nickel disilicide, and semiconductors such as silicon, gallium arsenide and other III-IV materials. The semiconductors may be doped with appropriate dopants to provide the desired energy level distribution in each quantum well layer.

The intervening dielectric layers 106, 108 may be any suitable material which is compatible with the conductive layers 102, 104, including aluminum oxide, calcium difluoride and semiconductor materials which have an energy gap which is greater than the energy gap of the quantum well conductive layer 102 or 104. The layers may be desirably formed as a monocrystalline heteroepitaxial structure by appropriate manufacturing processes such as molecular beam epitaxy, in which the respective layers are deposited sequentially on a suitable substrate 100. For such devices, the crystalline lattice constants of the material and dielectric layers should provide a suitable match such that the layers 102, 104, 106, 108 are united in an integral substantially monocrystalline structure. However, it is also contemplated that metallic layers which are not monocrystalline such as aluminum layers which are oxidized under precisely controlled conditions following deposition and prior to deposition of a subsequent aluminum layer, or which have a dielectric deposited thereon, may be provided in a suitable interleaved structure.

As indicated, the layer array 10 has periodicity in the direction orthogonal to the conductive sheets 102, 104. In this regard, the array 10 should best have at least about 20 and more preferably at least about 50 conductive layers alternating with dielectric layers, with each array comprising at least about 10 and more preferably at least about 25 conductive layers.

The characteristics of the conductor-insulator quantum-well heterostructures such as device 10 of FIG. 1 are related to the barrier height of the metal-insulator junction in accordance with quantum mechanical principles, as previously discussed. In this regard, neglecting interface states (which would tend to lower the barrier height) and thereby increase the probability of tunnelling through the barrier, an upper limit to the barrier height B may be estimated [e.g., see Sze, "Physics of Semiconductor Devices, 2nd Ed., John Wiley and Sons, New York, 1981] as the difference between the work function W and the electron affinity X (i.e., $B = W - X$) where W is the work function of a metal conductor layer defined as the energy difference between the vacuum level and the Fermi level, and X is the electron affinity of the insulator layer measured from the bottom of the conduction band to the vacuum level. For example, a preferred array is a monocrystalline heteroepitaxial array of a metal alloy alternating with a dielectric. For the epitaxial metal/insulator coupled heterostructures, the metal layers may desirably be a conductive crystalline metallic alloy such as $CoSi_2$ or $NiSi_2$ and the insulator may be a lattice matched, relatively nonconductive material such as $CaF_2$. For a system of cobalt disilicide conductive layers 102, 104 epitaxially deposited on and alternating with epitaxial calcium difluoride layers 106, 108, has an electron density of its conductive layers 102, 104 which is relatively high. In addition, the barrier height of the insulator layers 106, 108 is relatively high, such that all of the layers should be relatively thin. In this regard, applying a work function for cobalt disilicide of 4.69 eV, a band gap $E_g$ for calcium difluoride of 10.0 eV [Strehlow, et al., J. Phys. Chem. Ref. Data 2, 163 (1973)] and an energy difference between the valence band and the vacuum level of 12.3 eV [Poole, et al., Phys. Rev. B, 12, 5872 (1975)], provides a calculated electron affinity for calcium difluoride of 2.3 eV, and a calculated barrier height B for the $CoSi_2/CaF_2$ layer system of 2.39 eV. This value is significantly larger than the typical barrier height of about 0.6 eV for metal/silicon structures such as $CoSi_2$/silicon and about 0.2 eV for epitaxial GaAs/GaAlAs structures, and requires correspondingly narrower barrier structures between conductive quantum well layers than for coupled heterolattice structures fabricated from materials having lower barrier heights.

The insulated layers should be sufficiently thin to provide a significant tunneling current therethrough in the absence of applied electric field. For purposes of the present invention, tunneling current I through a barrier in the absence of an applied electric field may be represented as follows:

$$I \sim \exp\left(-t\sqrt{\frac{2mB}{\hbar^2}}\right) \qquad (28)$$

where B is the barrier height, m is the effective mass of the charge carrier, and t is the thickness of the barrier. For low barrier coupled heterolattice structures such as GaAs/GaAlAs structures, the effective electron mass is about 0.07 times the electron mass and the barrier height is about 0.2 eV. Current densities are sensitive functions of the barrier widths, and for effects of resonant tunneling to be observed in metal/insulator structures, the insulating layer must be very thin. For high barrier structures such as calcium difluoride insulator layers separating cobalt disilicide conductor layers, the effective charge carrier mass is approximately equal to the electron mass and the barrier height is about 2.4 eV. Accordingly, the thickness of high barrier insulating layers such as calcium fluoride layers separating a conductive disilicide or aluminum oxide layers separating aluminum metal quantum well layers, the high barrier insulator layer should be substantially thinner than a low barrier semiconductor insulator layer. For example, the current flow through a 10 Angstrom thick calcium difluoride insulator layer separating cobalt disilicide conductor layers may be on the order of a hundredth of that through a 50 Angstrom GaAlAs layer separating GaAs conduction layers. The tunnel current also depends on the Fermi function, which is essentially temperature independent for a metal or metal alloy layer over a broad range of useful temperatures, but strongly temperature-dependent for a semiconductor because of the larger Fermi energy of the metal. This provides a significant advantage for metal/insulator coupled heterostructures over semiconductor/semiconductor heterostructures. The tunneling current for the metal-high insulator system will be relatively temperature invariant, while a low barrier semiconductor system will have significantly reduced tunneling current as the system is heated to room temperature from a temperature approximately absolute zero. Desirably, the insulating thickness will be selected to provide a tunneling current in the range of from about $1 \times 10^{-1}$ to about $1 \times 10^6$ amperes per square centimeter, and more preferably in the range of from about $1 \times 10^2$ to about $1 \times 10^4$ amperes per square centimeter.

In manufacturing coupled heterolattice materials and devices in accordance with the present invention, conductor layers and insulator layers may be epitaxially deposited by means of molecular beam epitaxy (MBE). For example, the cubic-fluorite structure group II fluorides, $CaF_2$, $SrF_2$ and $BaF_2$, sublime as undissociated molecular units when heated [Farrow, et al., "MBE-Grown Fluoride Films—A New Class of Epitaxial Dielectrics", J. Vac. Sci. Technol. 19 415 (1981)]. Bulk $CaF_2$ has a large cohesive energy for crystallization and a high electrical resistivity of about $8 \times 10^{17}$ ohm-centimeter. Because of the similarity of the cubic fluorite structure to that of the diamond structure of silicon and the closeness of the lattice parameters of calcium difluoride and silicon (0.5% mismatch), such cubic fluorite materials may be deposited as an epitaxial insulator on a silicon substrate in accordance with conventional practice [Asano, et al., "An Epitaxial Si/Insulator/Si Structure Prepared by Vacuum Deposition of $CaF_2$ and Silicon", Thin Solid Films, 93, 143 (1982); Heiblum, "Tunneling Hot Electron Transfer Amplifiers (THETA): Amplifiers Operating Up to the Infrared", Solid State Electronics, 24, 343 (1981); Ishiwara, et al., "Silicon/Insulator Heteroepitaxial Structures Formed by Vacuum Deposition of $CaF_2$ and Si", Appl. Phys. Lett., 40, 66 (1982); Asano, et al., "Epitaxial Relations in Group-IIa Fluoride/Si(111) Heterostructures", Appl. Phys. Lett. 42, 517 (1983); Asano, et al., "Epitaxial Growth of Si Films on $CaF_2$ Structures with Thin Si Layers Predeposited at Room Temperature", J. Appl. Phys., 55, 3566 (1984); Ishiwara, et al., "Epitaxial Growth of Elemental Semiconductor Films onto Silicide/Si and Fluoride/Si Structures", J. Vac. Sci. Technol. B., 1, 266 (1983)]. In this regard, $CaF_2$ may be epitaxially deposited on Si(111) between 400° and 800° C. and on Si(100) at temperatures between 400° and 600° C., with calcium difluoride film resistivities greater than about $10^{13}$ ohm-cm. to produce a smooth $CaF_2$ film which is rotated 180° about the surface normal to the (111) axis of the silicon substrate in the so-called Type B orientation, in thicknesses ranging from a couple of monolayers to 1000 Angstroms [Fathauer, et al., "Surface Morphology of Epitaxial $CaF_2$ Films on Si Substrates", Appl. Phys. Lett. 45, 519 (1984)]. Metals that have lattice parameters close to that of $CaF_2$ include $NiSi_2$ (0.9% mismatch) and $CoSi_2$ (1.6% mismatch) [Tung, et al., "Epitaxial Silicides", Thin Solid Films 93, 77 (1982); Gibson, et al., "The Effects of Nucleation and Growth on Epitaxy in the $CoSi_2$/Si System", Thin Solid Films, 93, 99 (1982)]. Both $NiSi_2$ and $CoSi_2$ have the calcium difluoride type crystal structure. Defect-free continuous single crystal $NiSi_2$ films may be grown on both Si(111) and Si(100) by MBE techniques in accordance with conventional practice [Tung, et al., "Formation of Ultrathin Single-Crystal Silicide Films on Si: Surface and Interfacial Stabilization of Si-$NiSi_2$ Epitaxial Structures", Phys. Rev. Lett. 50, 429, (1983); Tung, et al., "Growth of Single Crystal Epitaxial Silicides on Silicon by Use of Template Layers", Appl. Phys. Lett. 42, 888 (1983)]. Very high quality single crystalline films of $CoSi_2$ may also be grown on Si(111) using molecular beam epitaxy techniques with codeposition of cobalt and silicon at 600°–650° C. or by codeposition followed by annealing techniques [Tung, et al., "Growth of Single-Crystal $CoSi_2$ on Si(111)", Appl. Phys. Lett., 40, 684 (1982); Bean, et al., "Silicon/Metal Silicide Heterostructure Grown by Molecular Beam Epitaxy", Appl. Phys. Lett., 37, 643 (1980); Saitoh, et al., "Double Heteroepitaxy in the Si(111)/CoSi$_2$/Si Structure", Appl. Phys. Lett., 37, 203 (1980)]. It is also noted that the orientation of such CoSi$_2$ epitaxial layers on monocrystalline silicon may also be of Type B orientation, in which the (111) axis of the CoSi$_2$ film is rotated 180° with respect to the (111) surface normal to the Si substrate.

Extremely thin layers of 10 Angstroms of NiSi$_2$ can be grown on silicon [Ishiwara, et al., "Epitaxial Growth of Elemental Semiconductor Films onto Silicide/Si and Fluoride/Si Structures", J. Vac. Sci. Technol. B., 1, 266 (1983)] and smooth films 10 Angstroms thick of CaF$_2$ can be grown on silicon in accordance with conventional procedures [Fathauer, "Surface Morphology of Epitaxial CaF$_2$ Films on Si Substrates", Appl. Phys. Lett., 45, 519 (1984)]. As indicated, thin insulating barriers of about 10–15 Angstrom thickness should be utilized to provide resonant tunneling in high barrier quantum-well structures.

Cobalt disilicide is preferred for heterostructures with calcium difluoride because it has a higher melting point (1326° C.) than NiSi$_2$ (993° C.).

Epitaxial heterostructures of CaF$_2$/CoSi$_2$ or CaF$_2$/NiSi$_2$ grown by MBE techniques with substrate temperatures in the range of 400°–700° C. are particularly preferred embodiments, as previously discussed.

Calcium difluoride as the insulator layers and either NiSi$_2$ or CoSi$_2$ as the metal layers are preferred for the growth of epitaxial metal/insulator heterostructures by means of molecular beam epitaxy techniques on a monocrystalline substrate such as silicon (111). Molecular beams of calcium difluoride may be provided by radiant heating while cobalt disilicide may be codeposited by electron beam heating of both Co and Si while maintaining the Co to Si flux at a ratio of 1:2. The temperature of the Si(111) substrate may be varied between 400° and 700° C. in order to optimize epitaxial deposition and inhibit the interdiffusion of different species.

While the illustrated embodiment 10 of FIG. 1 has a simple alternating array of quantum well conductors having coupled energy levels, it will be appreciated that other construction may also be provided. For example, more than two different types of conductive layers of different energy level spacing may be interleaved to increase or restrict the bandgap to energy levels mutually shared by the multiple, different layers. As another example, coupled heterostructure devices may be fabricated in which the zones of coupled quantum well layers are fabricated in a more complex manner as shown in FIG. 5, which represents a device 50 having a zone 502 of coupled heterostructure layers like those of FIG. 1 of a particular bandgap deposited on a suitable substrate 500. A zone 504 of coupled heterostructure layers like those of FIG. 1, but of different (e.g., lower) bandgap may be deposited upon the zone 502. A zone 506 of different (e.g., higher) bandgap than the zone 504 and different predominant charge carrier type (e.g., holes rather than electrons) than the zones 502, 504 may be provided to produce a device such as a laser in a light emitting diode. Moreover, it will be appreciated that coupled heterostructures having specific energy gaps may be provided themselves in array such that composite coupled heterostructures are provided as shown in FIG. 5.

Various aspects of the present invention involving metal-insulator heteroepitaxial structures may find utility in a wide variety of electronic devices. For example, single quantum well metal-insulator-metal-insulator-metal systems utilizing epitaxial calcium difluoride insulator, disilicide metal layers provide devices in which bulk conduction and thermionic emission current components are substantially relatively suppressed, so that tunnel current contributes significantly in a manner which is substantially temperature independent at typical useful ambient temperatures (e.g., 300° Kelvin). In this regard, illustrated in FIG. 6, is a single quantum well, tunneling hot electron transfer amplifier (THETA) device 600 [e.g., see Heiblum, "Tunneling Hot Electron Amplifiers (THETA): Amplifiers Operating up to the Infrared", Solid State Electronics, 24, 343 (1980)]. In the illustrated device, a metallic layer of a disilicide 602 such as nickel or cobalt disilicide is deposited epitaxially upon a monocrystalline silicon (111) substrate 604, as previously described. A substantially monocrystalline calcium difluoride insulator layer 606 having a thickness in the range of from about 10 Angstroms to about 15 Angstroms is epitaxially deposited on the disilicide layer 602, also as previously described. Similarly, a monocrystalline quantum well metallic layer 608 of a substantially lattice matched cobalt or nickel disilicide is epitaxially deposited on the insulator layer 606. In the illustrated embodiment 600, the metallic layer 608 may desirably have a thickness in the range of from about 30 to about 100 Angstroms to provide a quantum well. Similarly, a monocrystalline lattice matched insulator layer 610 of calcium difluoride like that of layer 606 is subsequently provided by epitaxial deposition on the layer 608. A capping layer 612 of a conductive material, which may similarly be a substantially monocrystalline epitaxial cobalt disilicide or nickel disilicide is provided by epitaxial deposition on the layer 610. Appropriate connections and device structures may be formed by masking and deposition techniques in accordance with conventional microelectronics fabrication procedures.

In the operation of the device 600, the metallic layer 602 may form the emitter of an electrical circuit with the quantum well layer 608 forming the base, separated by potential $V_{BE}$, as shown in FIG. 6. The metallic layer 612 may form the collector of the device, with an applied potential $V_{CB}$ between the collector and the base. Electrons tunneling through the barrier between the emitter 602 and the base 608 continue ballistically over the second barrier into the collector 612. The ballistic electrons are generally monoenergetic in the THETA device 600 because they all originate near the fermi energy in the emitter, and typically will suffer no collisions in the transfer process. The device 600 may provide high speed operation because it has a low collecting resistance and a low transit time. The device may have a small area (e.g., from about 1 to about 10 microns square), a tunneling impedance in the range of from about 10 to about 300 ohms and a relatively high current density (e.g., $1 \times 10^6$ amperes per square centimeter).

Various other modifications, adaptations and applications will be apparent from the present disclosure and are intended to be within the spirit and scope of the present invention as defined by the following claims.

What is claimed is:

1. A superlattice quantum well device comprising an integral periodic array of a plurality of quantum mechanically coupled conductive layers separated by relatively nonconductive insulation layers, said conductive layers comprising a first set of conductive layers each having a first set of discrete electronic energy levels of predetermined energy spacing and a second set of conductive layers each having a second set of discrete electronic energy levels of predetermined energy spacing different from said energy spacing of said first set of conductive layers, said conductive layers of said first set of layers being interleaved with said conductive layers of said second set of layers such that charge carriers may resonantly tunnel in the array through said insulator layers between said conductive layers at an energy level common to both said first set of discrete energy levels of said first set of conductive layers and said second set of energy levels of said second set of conductive layers.

2. A device in accordance with claim 1 wherein said device comprises at least about 10 conductive quantum well layers separated by thin insulation tunneling barrier layers.

3. A device in accordance with claim 1 wherein said conductive layers are composed of a metal or metal alloy having a charge carrier concentration of at least $10^{21}$ cm$^{-3}$ and a thickness in the range of from about 10 Angstroms to about 300 Angstroms.

4. A device in accordance with claim 1 wherein said conductive layers are composed of a semiconductor having a charge carrier concentration of at least $10^{17}$ cm$^{-3}$ and a thickness in the range of from about 10 Angstroms to about 300 Angstroms.

5. A device in accordance with claim 1 wherein the energy level spacings in each conductor layer are at least about $10^{-3}$ eV.

6. A device in accordance with claim 1 wherein said array is a monocrystalline heterostructure.

7. A device in accordance with claim 1 wherein said insulation layers are composed of a semiconductor having a bandgap at least 0.2 eV greater than the bandgap of said conductor layers.

8. A device in accordance with claim 1 wherein said insulation layers are composed of a high bandgap dielectric having a bandgap of at least about 2.0 eV, a bulk conductivity of less than about $1 \times 10^{-8}$ ohm$^{-1}$ cm$^{-1}$, and a thickness of less than about 20 Angstroms.

9. A quantum well device comprising a substantially monocrystalline metallic layer of a metallic compound selected from the group consisting of nickel disilicide and cobalt disilicide, a first substantially monocrystalline insulator layer of calcium difluoride epitaxially adjacent one side of said conductor layer, and a second substantially monocrystalline insulator layer of calcium difluoride epitaxially adjacent the other side of said metallic layer.

10. A device in accordance with claim 9 wherein said first and said second insulator layers have a thickness in the range of from about 10 to about 25 Angstroms, and wherein said metallic layer has a thickness in the range of from about 50 to about 500 Angstroms.

11. A heteroepitaxial composition comprising a substantially monocrystalline conductive layer selected from the group consisting of cobalt disilicide and nickel disilicide, and epitaxially adjacent thereto a substantially monocrystalline layer of calcium difluoride.

* * * * *

UNITED STATES PATENT AND TRADEMARK OFFICE
CERTIFICATE OF CORRECTION

PATENT NO. : 4,665,412

DATED : May 12, 1987

INVENTOR(S) : Tihiro Ohkawa and Lawrence S. Woolf

It is certified that error appears in the above-identified patent and that said Letters Patent is hereby corrected as shown below:

Column 1, line 33, change "ph" to --pn--.

Column 2, line 14, change "conductitve" to --conductive--;

line 62, change "have" to --having--.

Column 3, line 15, change "homogenous" to --homogeneous--;

line 23, change "volt" to --volts--.

Column 5, line 19, change "$\pi^2 \bar{n}^2 n^2$" to --$\pi^2 \hbar^2 n^2$--;

line 39, change "$\bar{n}^2$" to --$\hbar^2$--;

line 42, change "Vo" to --$V_0$--.

Column 6, line 6, change "$\pi^2 \bar{n}^2$" to --$\pi^2 \hbar^2$--;

line 14, after "[" insert --(--.

Column 7, line 3, change "$\bar{n}^2$" to --$\hbar^2$--;

line 3, change "$V^2$" to --$\nabla^2$--;

line 6, change "$1_1$" to --$\ell_1$--;

line 7, change "$1_2$" to --$\ell_2$--;

line 38, change "$\bar{n}^2$" to --$\hbar^2$--;

line 40, change "$\bar{n}^2$" to --$\hbar^2$--;

line 43, change "$\upsilon$" to --$\sigma$--.

UNITED STATES PATENT AND TRADEMARK OFFICE
CERTIFICATE OF CORRECTION

PATENT NO. 4,665,412

DATED   May 12, 1987

INVENTOR(S): Tihiro Ohkawa and Lawrence S. Woolf

It is certified that error appears in the above-identified patent and that said Letters Patent is hereby corrected as shown below:

Column 8, line 25, change "$\pi^2 \bar{n}^2$" to --$\pi^2 \hbar^2$--;

line 30, change "$\bar{n}^2 k_1$" to --$\hbar^2 k_1$--;

line 36, change "$2\pi^2 \bar{n}^2 N^2$" to --$2\pi^2 \hbar^2 N^2$--;

line 42, change "$K_2 \ell_1 sh k_2 \ell_2$" to --$k_2 \ell_1 sh k_2 \ell_2$--.

Column 9, line 3, change "$\pi^2 \bar{n}^2$" to --$\pi^2 \hbar^2$--;

line 8, change "$\pi^2 \bar{n}^2$" to --$\pi^2 \hbar^2$--;

line 17, change "$\bar{n}^2$" to --$\hbar^2$--;

line 19, change "$\bar{n}^2$" to --$\hbar^2$--;

line 27, change "$\bar{n}^2$" to --$\hbar^2$--.

Column 10, line 48, after "Devices" insert --"-- .

UNITED STATES PATENT AND TRADEMARK OFFICE
CERTIFICATE OF CORRECTION

PATENT NO. : 4,665,412

DATED : May 12, 1987

INVENTOR(S) : Tihiro Ohkawa and Lawrence S. Woolf

It is certified that error appears in the above-identified patent and that said Letters Patent is hereby corrected as shown below:

Column 14, line 51, change "fermi" to --Fermi--.

Signed and Sealed this

Eleventh Day of December, 1990

Attest:

HARRY F. MANBECK, JR.

*Attesting Officer*      *Commissioner of Patents and Trademarks*